United States Patent
Croffie et al.

(10) Patent No.: US 7,458,060 B2
(45) Date of Patent: Nov. 25, 2008

(54) YIELD-LIMITING DESIGN-RULES-COMPLIANT PATTERN LIBRARY GENERATION AND LAYOUT INSPECTION

(75) Inventors: Ebo H. Croffie, Portland, OR (US); Nicolas K. Eib, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 227 days.

(21) Appl. No.: 11/323,468

(22) Filed: Dec. 30, 2005

(65) Prior Publication Data

US 2007/0157153 A1    Jul. 5, 2007

(51) Int. Cl.
G06F 17/50 (2006.01)
G06F 9/45 (2006.01)
(52) U.S. Cl. ............................ 716/21; 716/5; 716/10
(58) Field of Classification Search ............ 716/5, 716/10, 21
See application file for complete search history.

(56) References Cited

U.S. PATENT DOCUMENTS

| 6,553,559 | B2 * | 4/2003 | Liebmann et al. | 716/19 |
| 7,194,725 | B1 * | 3/2007 | Lukanc et al. | 716/19 |
| 7,266,798 | B2 * | 9/2007 | Mansfield et al. | 716/11 |
| 2005/0050512 | A1 * | 3/2005 | Kochan et al. | 716/21 |
| 2006/0273266 | A1 * | 12/2006 | Preil et al. | 250/548 |

* cited by examiner

*Primary Examiner*—Thuan Do
*Assistant Examiner*—Magid Y Dimyan
(74) *Attorney, Agent, or Firm*—Strategic Patent Group

(57) ABSTRACT

A method and system are provided for analyzing process window compliance of an integrated circuit design. Aspects of the present invention include identifying layout pattern configurations that have process windows that fail to meet respective local performance specifications; searching for any layout pattern configurations in a design that substantially match any of the identified layout pattern configurations; and modifying any matching layout pattern configurations found in the design to make the layout pattern configurations compliant with their respective process windows.

15 Claims, 6 Drawing Sheets

YIELD-LIMITING DESIGN-RULES-COMPLIANT PATTERN LIBRARY GENERATION AND LAYOUT INSPECTION

FIELD OF THE INVENTION

The present invention relates to a method for analyzing process window compliance of an integrated circuit design, and more particularly to yield-limiting design-rules-compliant pattern library generation and layout inspection.

BACKGROUND OF THE INVENTION

The minimum feature sizes of integrated circuits (ICs) have been shrinking for years. Commensurate with this size reduction, various process limitations have made IC fabrication more difficult. One area of fabrication technology in which such limitations have appeared is photolithography. Photolithography is a process used in semiconductor device fabrication to transfer a pattern from a photomask (also called reticle) to the surface of a substrate. The pattern of the photomask ("mask") corresponds to features on one layer in an IC design. As light passes through the mask, it is refracted and scattered by the mask edges. This causes the projected image to exhibit some rounding and other optical distortion. While such effects pose relatively little difficulty in layouts with large feature sizes (e.g., layouts with critical dimensions above about 1 micron), they cannot be ignored in layouts having features smaller than about 1 micron. The problems become especially pronounced in subwavelength lithography in which features of a device design are printed that are smaller than the wavelength of light used in the photolithographic process.

Lithography design rules define the parameters for controlling how a particular IC is designed and fabricated using a particular process technology. Examples of such parameters include minimum and maximum feature sizes and spacing. The design rules also include process latitude specifications that are defined to guarantee manufacturability of each processing step. For example, in the photolithography processing step, a minimum combined depth of focus for a given exposure latitude is specified to guarantee printability of layout patterns of a given layer in the design layout. The process latitude specifications define lithography process windows for many of the parameters in the design rules. Process windows represent the amount of allowed critical dimension (CD) and overlay variation of features during manufacturing. As design rules controlling the printing of such features continue to shrink, so too are lithography process windows. This affects the focus and exposure latitude within which a desired feature can be printed within design rule specification.

Resolution enhancement techniques such as optical proximity correction (OPC), phase-shift masks and double exposure are used to enable pattern printing in subwavelength lithography. Optical proximity correction involves adding dark regions to and/or subtracting dark regions from a mask design at locations chosen to overcome the distorting effects of diffraction and scattering. Typically, OPC is performed on a digital representation of a desired IC pattern. The digital pattern is evaluated with software to identify regions where optical distortion will result, and a digital representation of the mask design is modified to create an optically corrected or OPC mask.

Given the many different feature types, sizes, densities and configurations of layout patterns, however, some of the patterns in the layout will not meet the process latitude specifications even with OPC and would tend to reduce a common process window and yield of the design layer. Because of proximity effects during printing, the effect on each feature by neighboring shapes ripples through the design. The process window simulation typically attempts to calculate all these rippling effects through brute force and then identify areas in the design layout that result in very small or non-compliant process windows. Given the size of data for a given design, it is prohibitively expensive to analyze the process window compliance of the entire design layer. For example, a typical 10 mm×10 mm design layout may comprise millions of features. Generally, the computational time required to analyze process window compliance of a design layer is the square of the area to be processed.

If the design layout calls for a change in any of the optical parameters (e.g., dose or focus), the process window calculations have to be performed over again. If it takes one day at one dose and focus setting to perform the calculation, for example, and the design layout calls for a change in dose or focus, many days may be needed to complete the calculations. The time to perform the calculation may be reduced but requires a massive investment in hardware.

Accordingly, there is a need for an improved method for analyzing process window compliance of an IC design. The present invention addresses such a need.

BRIEF SUMMARY OF THE INVENTION

The present invention provides a method and system for analyzing process window compliance of an integrated circuit design. Aspects of the present invention include identifying layout pattern configurations that have process windows that fail to meet respective local performance specifications; searching for any layout pattern configurations in a design that substantially match any of the identified layout pattern configurations; and modifying any matching layout pattern configurations found in the design to make the layout pattern configurations compliant with their respective process windows.

According to the method and system disclosed herein, the present invention pre-calculates sets of pattern configurations known to limit yields and by using these yield-limiting pattern configurations to find similar patterns in real designs, the design can be modified to conform to the process window requirements without the need to perform process window compliance calculations on every feature in the design. In addition, the present invention can be used for performing OPC verification prior to performing the lithography process, rather than after the lithography process.

DETAILED DESCRIPTION OF THE INVENTION

The present invention relates to a method and system for analyzing process window compliance of a design. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention is mainly described in terms of particular systems provided in particular implementations. However, one of ordinary skill in the art will readily recognize that this method and system will operate effectively in other implementations. For example, the systems, devices, and networks usable with the present invention can take a number of different forms. The present invention will also be described in the context of particular methods having certain steps. However, the method and system operate effectively for other methods having different and/or additional steps not inconsistent with the present invention.

The present invention provides a method for analyzing process window compliance of an IC design. The method includes identifying specific pattern configurations that are known to limit a common process window for a design layout, and then using these yield-limiting pattern configurations when calculating process window compliance for a design to be manufactured by searching for the yield-limiting pattern configurations in the design data and modifying them to improve their process windows. In a further aspect of the present invention, the yield-limiting pattern configurations are identified by first generating a set of design-rule-compliant pattern configurations, simulating their process windows, and generating a library of the pattern configurations found to be yield-limiting because their process windows are non-compliant with the design rules. The library can then be used to inspect/search a given design layer for occurrence of these yield-limiting patterns to be modified to improve yield. The search for the yield-limiting pattern configurations in the design may be performed through design rule checking scripts or by using pattern matching software tools.

Figure 1:
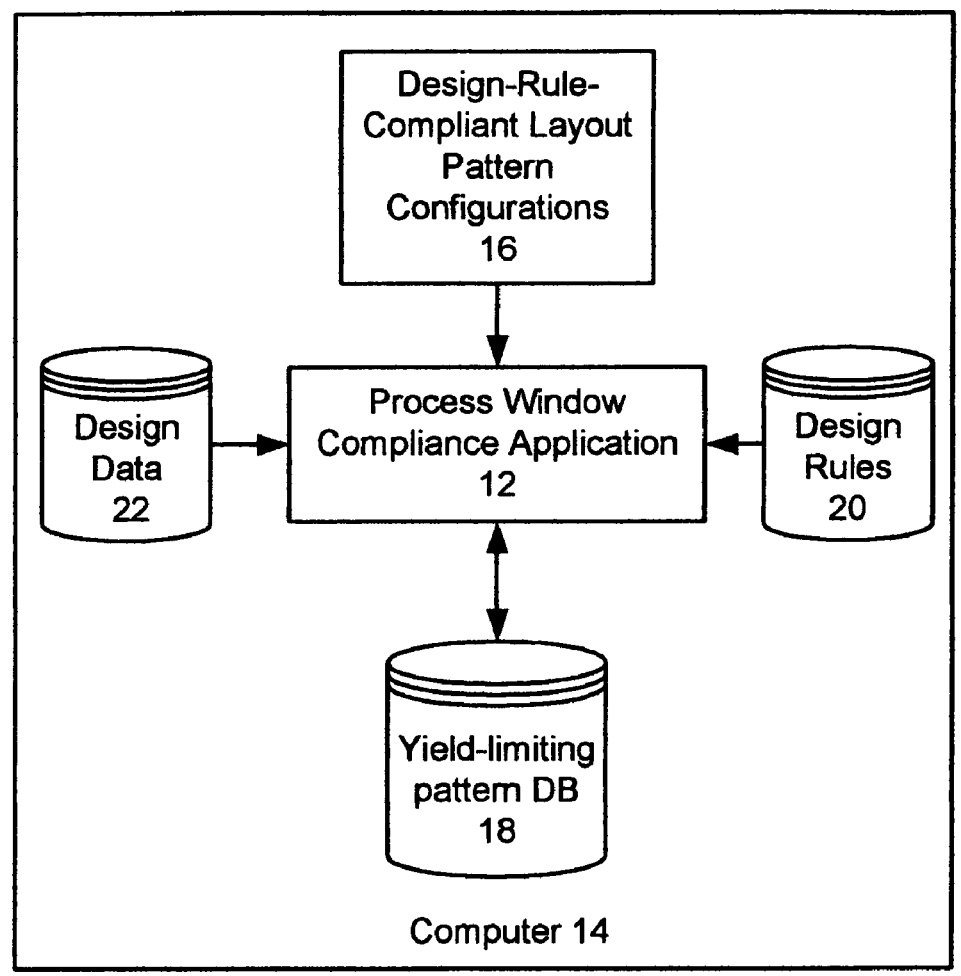
FIG. 1 is a block diagram illustrating a system for analyzing process window compliance of a design according to a preferred embodiment of the present invention.

FIG. 1 is a block diagram illustrating a system for analyzing process window compliance of a design according to a preferred embodiment of the present invention. The system 10 includes a process window compliance application 12 that executes in a computer 14, which may represent an engineering workstation or server that is accessed over a network (not shown), for example. The computer 14 preferably includes a microprocessor that is coupled to a non-volatile storage device, e.g., a conventional hard disk storage device. The microprocessor and the hard disk storage device are coupled to a volatile storage device, e.g. a random access memory (RAM). A monitor may be coupled to the workstation for displaying a user interface of the process window compliance application 12.

Inputs to the process window compliance application 12 may include a set of design-rule-compliant pattern configurations 16, design data 22, and design rules 20. An output of the process window compliance application 12 is a yield limiting pattern database 18.

Figure 2:
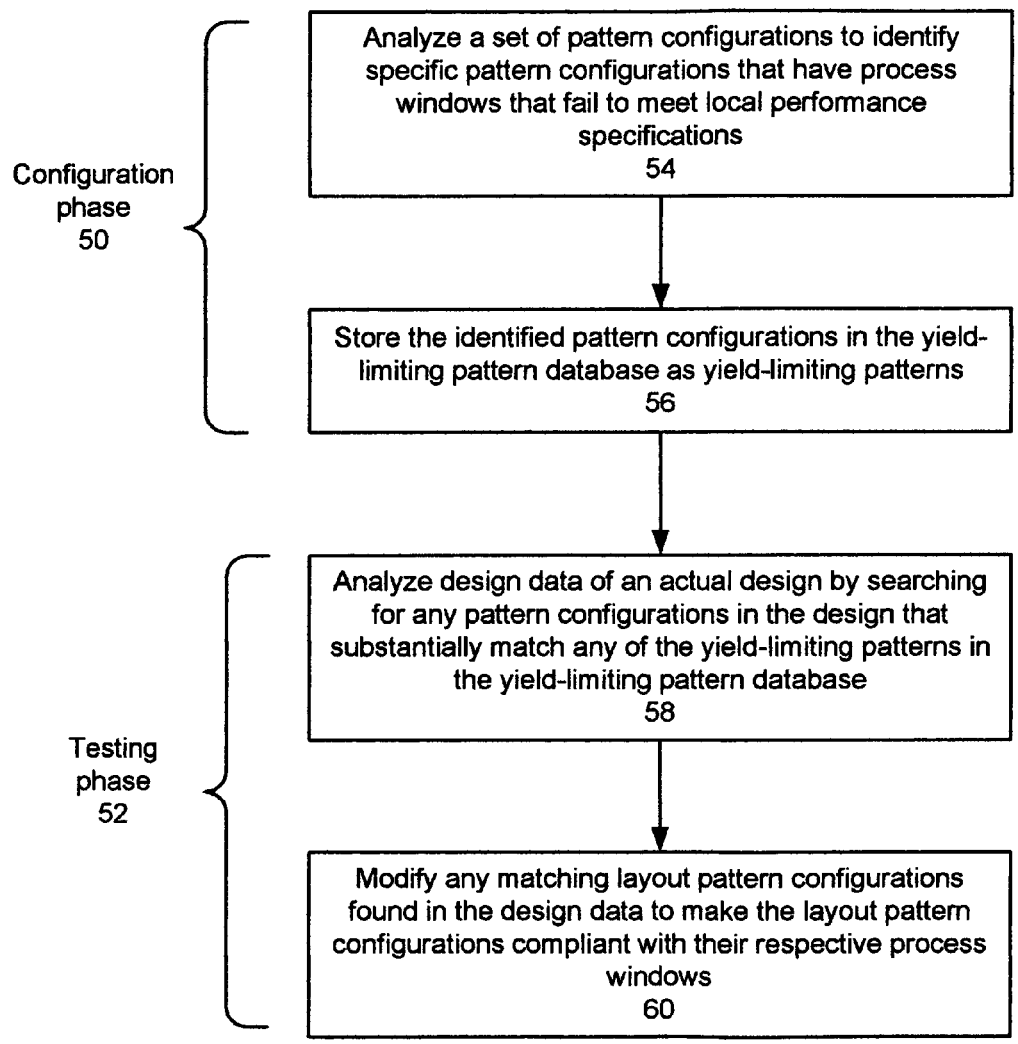
FIG. 2 is a flow diagram illustrating the process performed by the process window compliance application in accordance with a preferred embodiment.

FIG. 2 is a flow diagram illustrating the process performed by the process window compliance application 12 in accordance with a preferred embodiment. Operation of the process window compliance application 12 includes a configuration phase 50 and a testing phase 52. The configuration phase 50 begins in step 54 when the process window compliance application 12 analyzes the set of layout pattern configurations 16 to identify layout pattern configurations 16 that have process windows that fail to meet respective local performance specifications. In step 56, the identified pattern configurations are stored in the yield-limiting pattern database 18 as yield-limiting patterns. In an alternative embodiment, the yield-limiting patterns may be stored in a library or table.

Figure 3:
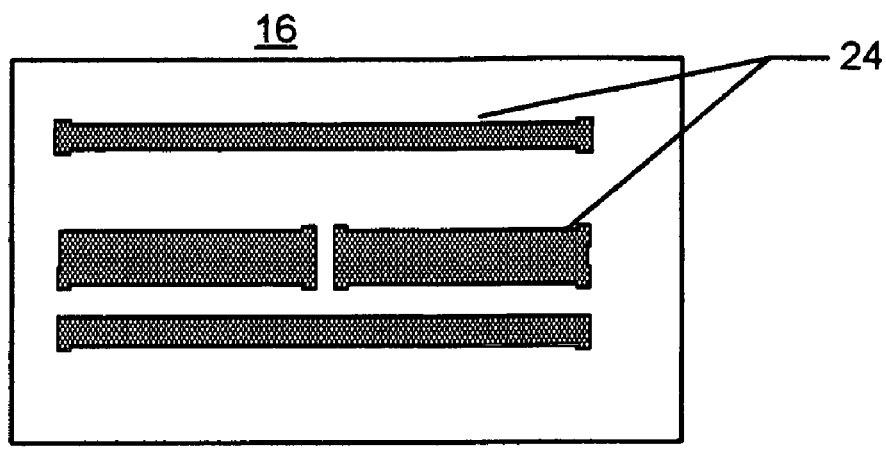
FIG. 3 is a block diagram illustrating an example design-rule-compliant pattern configuration.

FIG. 3 is a block diagram illustrating an example design-rule-compliant pattern configuration 16. Each pattern configuration 16 preferably comprises design-rule-compliant feature types 24 and a specification of the sizes of the feature types and spaces there between. Example types of features include lines, line-ends, and contacts. The design-rule-compliant pattern configurations 16 also include information defining the spacing between the feature types 24. Each of the design-rule-compliant pattern configurations 16 is designed to create a layout of features and spaces to mimic actual random logic and SRAM layout pattern configurations using random logic and memory process design rules 22. The design-rule-compliant pattern configurations 16 may also be OPCed. Preferably, the pattern configurations 16 are designed sufficiently small enough or fast process window simulations.

Figure 4:
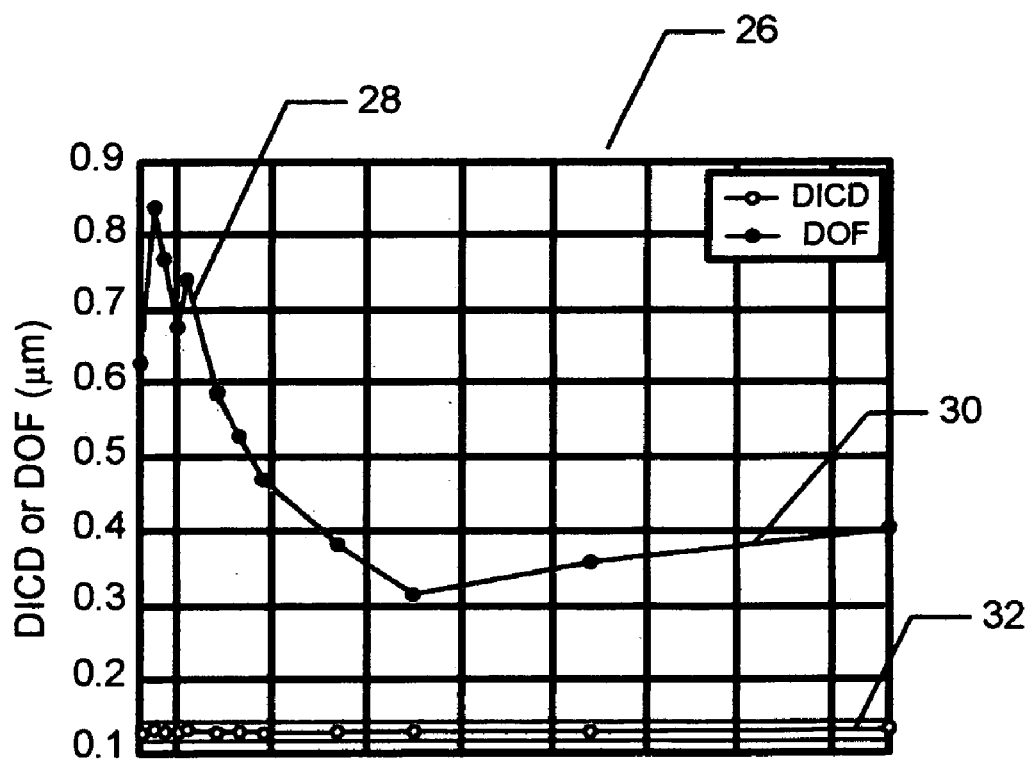
FIG. 4 is a diagram illustrating an example process window for the pattern configurations shown in FIG. 3.

FIG. 4 is a diagram illustrating an example process window for the pattern configuration 16 shown in FIG. 3. The process window 26 was generated as a depth of focus (DOF) simulation (line 28). The graph shows the critical dimension (CD) performance specification 30 plotted as a function of DOF (y-axis) and pitch (x-axis). The results of CD at best dose and best focus are shown by line 32. The DOF simulation (line 28) shows that CDs are within specifications, but some DOF point fall below the specified limits for certain spacing (pitch) shown by line 30. This means that if this pattern configuration 16 was manufactured, at certain pitches, which is controlled by the optical setup, some spacing between these features may deviate too far from local performance specifications. Thus, because this pattern 16 does not meet the performance specifications, this pattern may be placed in the yield-limiting pattern database 18.

Referring again to FIG. 2, after the yield-limiting pattern database 18 is generated, the yield-limiting pattern database 18 may be used in the testing phase 52 to inspect/test an actual design to be manufactured. In step 58, the process window compliance application 12 analyzes the design data 22 of a design to be manufactured by searching for any pattern configurations in the design data 22 that substantially match any of the yield-limiting patterns in the yield-limiting pattern database 18. In step 60, any matching yield-limiting pattern configurations found in the design data 22 are modified as necessary to make the layout pattern configurations compliant with their respective process windows, thereby generating process window compliant designs without the need to perform window compliance calculations on every feature in the design.

Figure 5:
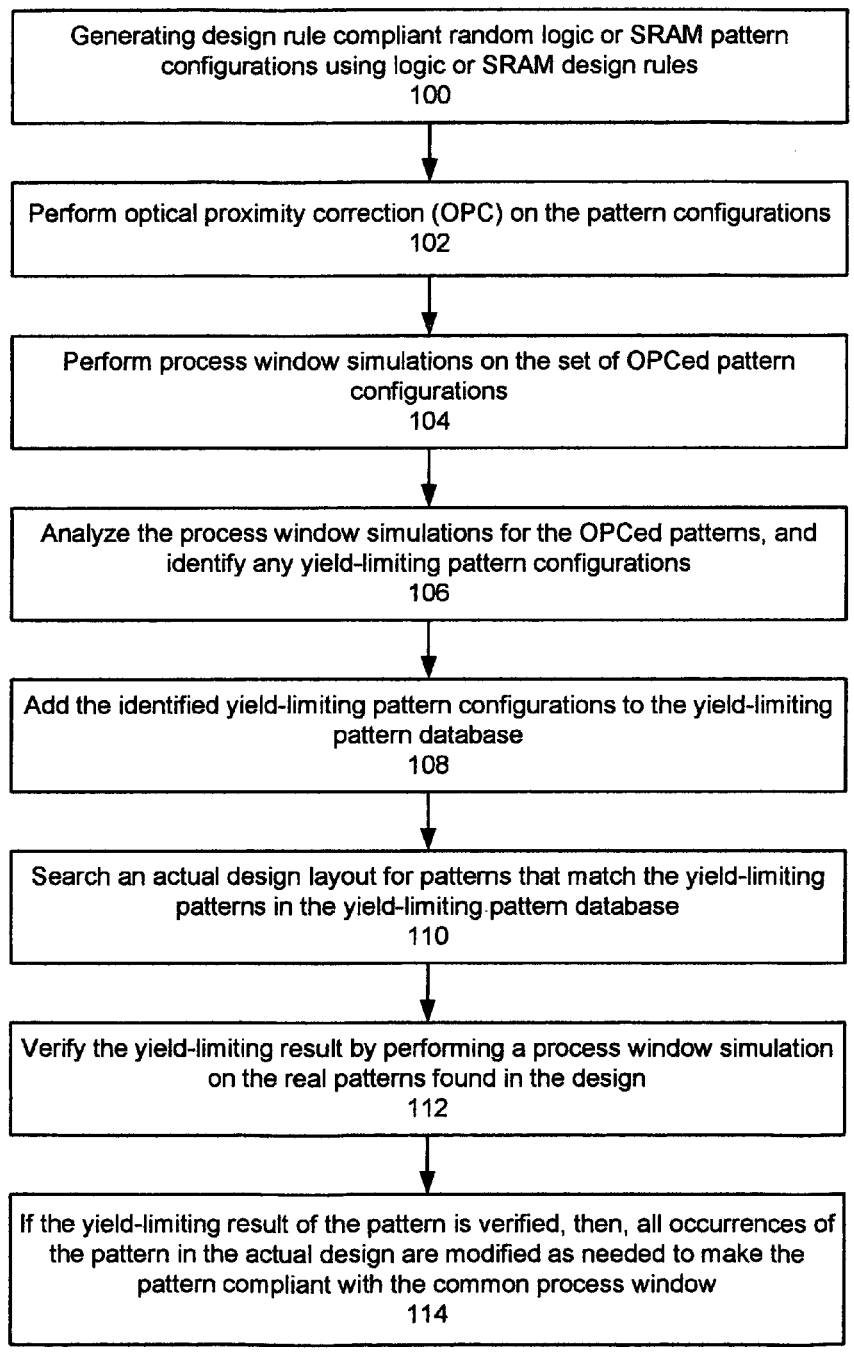
FIG. 5 is a flow diagram illustrating a process for yield-limiting layout pattern library generation, inspection and correction in accordance with the preferred embodiment.

FIG. 5 is a flow diagram illustrating a process for yield-limiting layout pattern library generation, inspection and correction in accordance with the preferred embodiment. The process begins in step 100 by generating design-rule-compliant random logic or SRAM pattern configurations using logic or SRAM design rules. The input to the step may either be a synthetic pattern generated from design rules 20, or a pattern taken from an existing design layout. Determining which pattern configurations 16 to generate may be based on identifying those patterns that occur most often in actual designs.

After the design-rule-compliant random logic or SRAM pattern configurations are generated, in step 102, optical proximity correction (OPC) is performed on the pattern configurations to create a set of one more OPCed pattern configurations. For synthetic patterns, OPC may be performed using a preferred OPC model, while for a real pattern, OPC may be performed using the OPC model used to manufacture the real pattern.

In step 104, process window simulations are performed on the set of OPCed pattern configurations. In a preferred embodiment, the process simulations may be performed using physical process simulation tools such as STORM, Prolith, Sigma-C, or other types of lithographic simulation software.

In step 106, the process window simulations for the OPCed patterns are analyzed, and any yield-limiting pattern configurations are identified. In step 108, the identified yield-limiting pattern configurations are added to a yield-limiting pattern database, preferably with the relevant process parameters. These are features that cannot be printed within a usable process window, or in other words those features whose process windows are too small to be manufacturable, or more simply, those features that are not process window compliant. This may be dependent on the quality of the mask used.

Steps 100 through 108 may be repeated for each layer of a design and the process technology used. In an alternative embodiment, rather than repeating the steps for each layer of the design, the steps may be performed on only the critical or yield-limiting layers of the design. Thus, steps 100 through 108 constitute the configuration phase 50, where the steps are performed for each layer and each process technology. At the end of the configuration phase 50, the yield-limiting pattern database 18 contains information on each layer. In an alternative embodiment, a separate yield-limiting database may be generated for each layer. According to a further aspect of the preferred embodiment, the yield-limiting pattern configurations in the database may be ranked in the order of importance so that more problematic patterns found in a real design can be corrected in the order of priority.

After the yield-limiting pattern database 18 is generated, the yield-limiting pattern database 18 is used to inspect, verify, and correct an actual design. In step 110, the actual design layout is searched for patterns that match the yield-limiting patterns in the yield-limiting pattern database 18. This is preferably accomplished using design verification tools such as a design rule checker or a pattern matching software tool, such as PATTERN MATCHER from UC Berkeley. In a preferred embodiment, only the patterns in the yield-limiting pattern database are searched for in the design layout, and not the process parameters used to generate the patterns.

When a pattern in the actual design layout is found that potentially matches an identified yield-limiting pattern from the yield-limiting layout pattern database 18, in step 112, a process window simulation is optionally performed on the real pattern to verify the yield-limiting result and ensure that the pattern is not a false positive. This step could be important in the instance where the identified yield-limiting pattern occurs many times in the actual design (e.g., 300 occurrences) and time is to be spent correcting each pattern, then the designer should be sure that there is a real problem.

If the yield-limiting result of the pattern is verified, then in step 114, all occurrences of the pattern in the actual design are modified as needed to make the pattern compliant with the common process window. The violations found in the design may be corrected by modifying either the OPC recipe, the design layout, or both, to ensure manufacturability.

Figure 6:
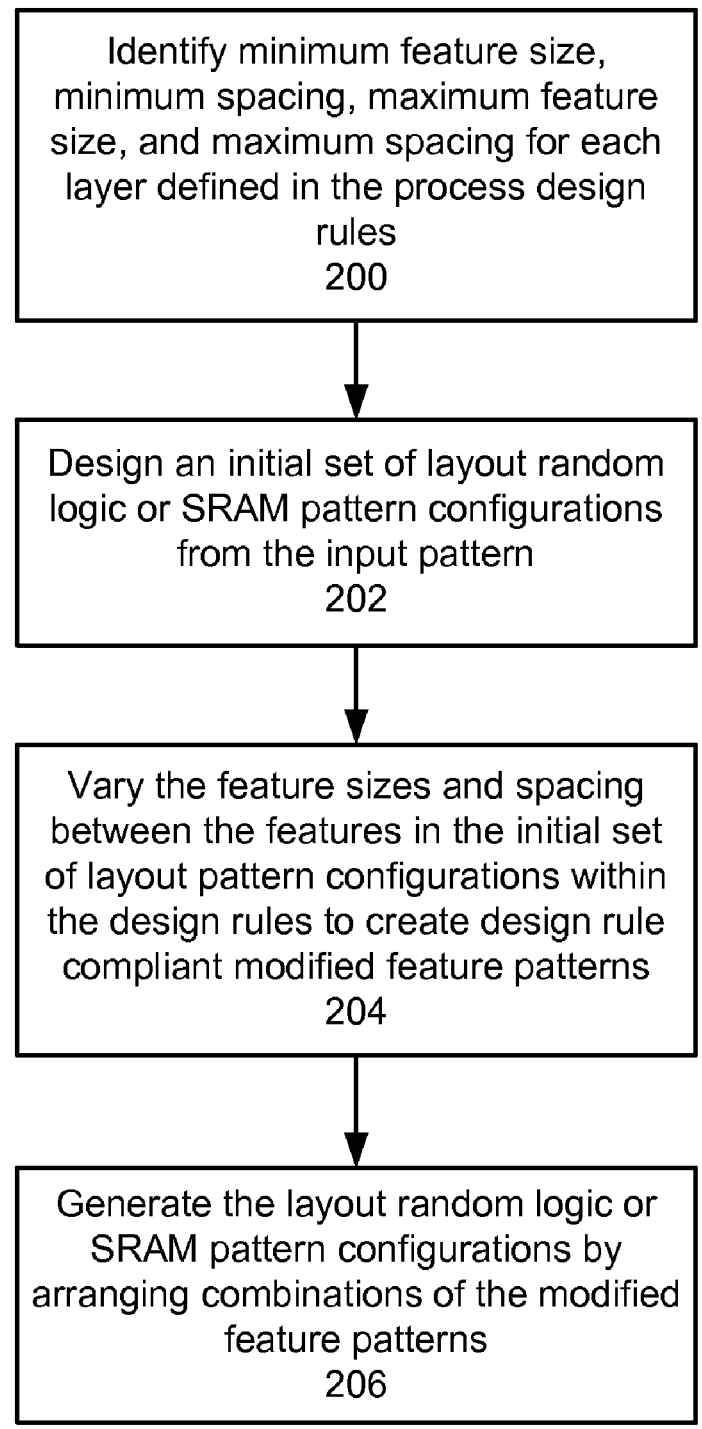
FIG. 6 is a flow diagram illustrating the process of generating the random logic or SRAM pattern configurations shown in step 100 of FIG. 5 in further detail.

FIG. 6 is a flow diagram illustrating the process of generating the random logic or SRAM pattern configurations shown in step 100 of FIG. 5 in further detail. Given an input synthetic or real layout pattern, the process begins in step 200 by identifying minimum feature size, minimum spacing, maximum feature size, and maximum spacing for each layer defined by process design rules 20 associated with the layout pattern. In step 202, an initial set of layout random logic or SRAM pattern configurations are designed from the input pattern using appropriate scripting language, programming language, or software tools.

In step 204, the feature sizes and spacing between the features in the initial set of layout pattern configurations are varied within the design rules 20 to create design-rule-compliant modified feature patterns. Preferably, a pseudo random number generator is used to vary the feature sizes and spacing between the features. The idea behind this step is to generate many, if not all, of the permutations or combinations between the features that are design rule compliant.

In step 206, the layout random logic or SRAM pattern configurations 16 are generated by arranging combinations of the modified feature patterns, preferably using a pattern generation software tool or layout editors.

Figure 7:
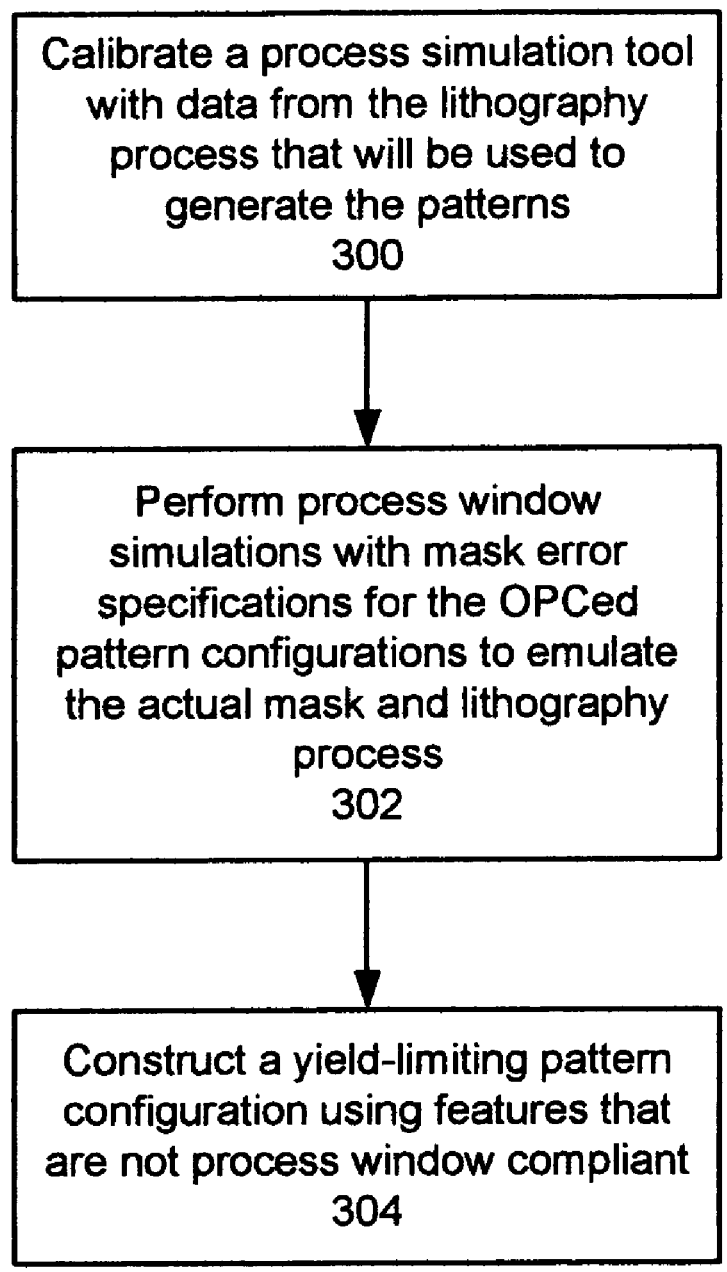
FIG. 7 is a flow diagram illustrating the process of performing process window simulation (step 104 of FIG. 5) in further detail.

FIG. 7 is a flow diagram illustrating the process of performing process window simulation (step 104 of FIG. 5) in further detail. The process begins in step 300 by calibrating the process simulation tool, such as STORM, with data from the mask and lithography process that will be used to generate the pattern configurations. In step 302, the process window simulations are performed with mask error specifications for the OPCed pattern configurations to emulate the mask and lithography process. In step 304, a yield-limiting pattern configuration is built using features that are not process window compliant.

A method for analyzing process window compliance of an IC design has been disclosed. The method and system disclosed herein may also be used for performing OPC verification prior to performing the lithography process, rather than after.

The present invention has been described in accordance with the embodiments shown, and one of ordinary skill in the art will readily recognize that there could be variations to the embodiments, and any variations would be within the spirit and scope of the present invention. For example, the present invention can be implemented using hardware, software, a computer readable medium containing program instructions, or a combination thereof. Software written according to the present invention is to be either stored in some form of computer-readable medium such as memory or CD-ROM, or is to be transmitted over a network, and is to be executed by a processor. Consequently, a computer-readable medium is intended to include a computer readable signal, which may be, for example, transmitted over a network. Accordingly, many modifications may be made by one of ordinary skill in the art without departing from the spirit and scope of the appended claims.

We claim:

1. A computer-implemented method for analyzing process window compliance of a design, comprising:

during a configuration phase, identifying layout pattern configurations that have process windows that fail to meet respective local performance specifications, and storing the identified layout pattern configurations in a database;

using the database during a testing phase to inspect/test a design to be manufactured by, searching for any layout pattern configurations in the design that substantially match any of the identified layout pattern configurations; and modifying any matching layout pattern configurations found in the design to make the layout pattern configurations compliant with their respective process windows without having to perform process window compliance calculations on every feature in the design.

2. The method of claim 1 further comprising storing the identified pattern configurations in a yield-limiting pattern database.

3. The method of claim 1 wherein searching for the layout pattern configurations in the design further comprises performing process window simulation on the matching layout pattern configurations found in the design to verify that the layout patterns are yield-limiting.

4. The method of claim 1 wherein identifying layout pattern configurations further comprises:

generating design-rule-compliant pattern configurations using design rules;

performing optical proximity correction (OPC) on the design-rule-compliant pattern configurations to create a set of one more OPCed pattern configurations;

performing process window simulations on the set of OPCed pattern configurations; and analyzing the process window simulations for the OPCed patterns, and identifying any yield-limiting pattern configurations.

5. The method of claim 4 wherein the layout pattern configurations comprise at least one of random logic pattern configurations and SRAM pattern configurations.

6. The method of claim 4 wherein generating the layout pattern configurations further comprises:

given as input at least one of a synthetic layout pattern and real layout pattern, identifying minimum feature size, minimum spacing, maximum feature size, and maximum spacing for each layer defined by process design rules for the layout pattern;

designing an initial set of layout pattern configurations from the input pattern;

varying the feature sizes and spacing between the features in the initial set of layout pattern configurations within the design rules to create design-rule-compliant modified feature patterns; and generating the layout pattern configurations by arranging combinations of the modified feature patterns.

7. The method of claim 4 wherein performing process window simulations on the set of OPCed pattern configurations further comprises:

calibrating a process simulation tool with data from a mask lithography process that will be used to generate the pattern configurations;

performing the process window simulations with mask error specifications for the OPCed pattern configurations to emulate the mask and lithography process; and building a yield-limiting pattern configuration using features that are not process window compliant.

8. An executable software product stored on a computer-readable medium containing program instructions for analyzing process window compliance of a design, the program instructions for:

during a configuration phase, identifying layout pattern configurations that have process windows that fail to meet respective local performance specifications, and storing the identified layout pattern configurations in a database;

using the database during a testing phase to inspect/test a design to be manufactured by, searching for any layout pattern configurations in the design that substantially match any of the identified layout pattern configurations, and storing the identified layout pattern configurations in a database; and modifying any matching layout pattern configurations found in the design to make the layout pattern configurations compliant with their respective process windows without having to perform process window compliance calculations on every feature in the design.

9. The software product of claim 8 further comprising storing the identified pattern configurations in a yield-limiting pattern database.

10. The software product of claim 8 wherein searching for the layout pattern configurations in the design further comprises performing process window simulation on the matching layout pattern configurations found in the design to verify that the layout patterns are yield-limiting.

11. The software product of claim 8 wherein identifying layout pattern configurations further comprises:

generating design-rule-compliant pattern configurations using design rules;

performing optical proximity correction (OPC) on the design-rule-compliant pattern configurations to create a set of one more OPCed pattern configurations;

performing process window simulations on the set of OPCed pattern configurations; and analyzing the process window simulations for the OPCed patterns, and identifying any yield-limiting pattern configurations.

12. The software product of claim 11 wherein the layout pattern configurations comprise at least one of random logic pattern configurations and SRAM pattern configurations.

13. The software product of claim 11 wherein generating the layout pattern configurations further comprises:

given as input at least one of a synthetic layout pattern and real layout pattern, identifying minimum feature size, minimum spacing, maximum feature size, and maximum spacing for each layer defined by process design rules for the layout pattern;

designing an initial set of layout pattern configurations from the input pattern;

varying the feature sizes and spacing between the features in the initial set of layout pattern configurations within the design rules to create design-rule-compliant modified feature patterns; and generating the layout pattern configurations by arranging combinations of the modified feature patterns.

14. The software product of claim 11 wherein performing process window simulations on the set of OPCed pattern configurations further comprises:

calibrating a process simulation tool with data from a mask lithography process that will be used to generate the pattern configurations;

performing the process window simulations with mask error specifications for the OPCed pattern configurations to emulate the mask and lithography process; and building a yield-limiting pattern configuration using features that are not process window compliant.

15. A system for analyzing process window compliance of a design, comprising:
- a memory for storing layout pattern configurations, design data for a design, and local performance specifications; and
- a processor coupled to the memory for executing a process compliance window application, the process compliance window application functional for,
  - during a configuration phase, identifying the layout pattern configurations that have process windows that fail to meet respective local performance specifications, and storing the identified layout pattern configurations in a database;
  - using the database during a testing phase to inspect/test a design to be manufactured by,
    - searching for any layout pattern configurations in the design data that substantially match any of the identified layout pattern configurations; and
    - modifying any matching layout pattern configurations found in the design data to make the layout pattern configurations compliant with their respective process windows without having to perform process window compliance calculations on every feature in the design.

* * * * *